US005861574A

United States Patent [19]

Kotani et al.

[11] Patent Number: 5,861,574

[45] Date of Patent: Jan. 19, 1999

[54] APPARATUS FOR MOUNTING A SUPERCONDUCTING ELEMENT

[75] Inventors: Seigo Kotani, Kawasaki; Yasuharu Kamioka; Shigeru Yoshida, both of Tokyo, all of Japan

[73] Assignees: Fujitsu Limited, Kawasaki; Toyo Sanso Co. Ltd., Tokyo, both of Japan

[21] Appl. No.: 215,779

[22] Filed: Mar. 22, 1994

[30] Foreign Application Priority Data

| | | | |
|---|---|---|---|
| Apr. 14, 1993 | [JP] | Japan | 5-087479 |
| Nov. 4, 1993 | [JP] | Japan | 5-275800 |

[51] Int. Cl.[6] ..... H01L 39/04

[52] U.S. Cl. ..... 174/15.4; 62/51.1; 335/216; 505/885; 505/888; 505/892; 505/898

[58] Field of Search ..... 174/15.4, 15.5; 505/163, 190, 875, 883, 885, 888, 894, 895, 898, 899, 892; 335/216; 62/51.1

[56] References Cited

U.S. PATENT DOCUMENTS 4,970,868 11/1990 Grebe et al. ..... 62/51.1

FOREIGN PATENT DOCUMENTS 0136301 7/1985 Japan ..... 174/15.4
2-123774 5/1990 Japan .

OTHER PUBLICATIONS

Rideout, "Close–Cycle Liquid Nitrogen Refrigeration System for Low–Temperature Computer Operation" IBM Technical Disclosure Bulletin, vol. 18, NO. 4, 9–1975, pp. 1226–1229.

S. Kotani et al., "A Subnanosecond Clock Cryogenic System for Josephson Computers", *IEEE Transactions on Applied Superconductivity,* vol. 1, No. 4, Dec. 1991, pp. 164–168.

*Primary Examiner*—Hyung-Sub Sough
*Attorney, Agent, or Firm*—Staas & Halsey

[57] ABSTRACT

An apparatus for mounting a superconducting element includes a first chamber which accommodates a first coolant and maintains the superconducting element at a very low temperature, a second chamber which accommodates a second coolant and is thermally connected to the first chamber via a barrier member, the second coolant being liquidized at a temperature lower than that of the first coolant, and a cooling device which is connected to the second chamber and liquidizes the first coolant.

25 Claims, 7 Drawing Sheets

APPARATUS FOR MOUNTING A SUPERCONDUCTING ELEMENT

BACKGROUND OF THE INVENTION

1. Field of the Invention

The present invention generally relates to apparatuses for mounting a superconducting element and, more particularly, to an apparatus for mounting a superconducting element needed to be cooled.

Recently, a large number of superconducting integrated circuits utilizing Nb Josephson elements has been reported. The circuits utilizing the Josephson-junction elements offer high-speed operation and low power dissipation, and hence make it possible to achieve high-speed processors. In operation, the superconducting element must be kept at a very low temperature (269° C. below zero for a Nb element). Hence, the apparatus for holding the superconducting element at a very low temperature is a very important factor.

2. Description of the Prior Art

Normally, liquid helium is used as a coolant to operate the Nb Josephson-junction element. More particularly, a superconducting circuit chip is placed in a Dewar vessel accommodating liquid helium, and is electrically connected to a device placed in the room-temperature atmosphere by means of a coaxial cable. This structure needs the coaxial cable to be 1 m long at least. In this case, the propagation delay time is estimated to be approximately 10 ns. Such a delay time does not operate the superconducting circuit at high speed (for example, 1 ns or less).

With the above in mind, the following apparatus for mounting a superconducting element has been proposed (Japanese Patent Application No. 63-276023).

FIG. 1 shows an apparatus 1 for mounting a superconducting element proposed in the above Japanese patent application. The mounting apparatus 1 accommodates a circuit board 3 on which an integrated circuit chip 2 to be cooled, such as a Nb Josephson-junction element is mounted. The circuit board 3 is placed in a coolant of liquid helium in an inner housing of a Dewar vessel (cooling chamber) 7, which has an outer housing outside of the inner housing. An electric-signal cable 9 penetrates through a vacuum adiabatic layer 8 formed between the inner housing and the outer housing, and electrically connects the cooled integrated circuit chip 2 and a room-temperature-operation circuit chip 4 mounted on a circuit board 5. The above structure makes it possible to arrange the chip 2 and the chip 4 close to each other and hence reduces the length of the electric-signal cable 9 between the cooled integrated circuit chip 2 and the room-temperature-operation chip 4 to one-tenth or less. As a result, high-speed synchronizing operation on the chips 2 and 4 can be achieved.

A cooling head 11 connected to a refrigerating machine 10 is provided in the upper portion of the Dewar vessel 7, and reliquidizes helium evaporated by heat from the cable 9 and heat generated by the chip 2. In this manner, the chip 2 is continuously cooled by the liquid helium 6.

However, the apparatus shown in FIG. 1 has a disadvantage in that the Dewar vessel 7 has a single cooling area, and hence there is no degree of freedom in the arrangement of the refrigerating machine 10 and the cooling head 11. The refrigerating machine 10 and the cooling head 11 are necessarily disposed in the upper position of the Dewar vessel 7 taking into account the following.

In order to establish the stable operation of the cooled integrated circuit chip 2, it is necessary to place the chip 2 in the liquid helium 6 to keep the operation temperature constant. The liquid helium 6 is evaporated due to heat generated by the chip 2 and heat from the cable 9. The cooling head 11 cools the evaporated helium and reliquidizes it, so that the quantity of liquid helium 6 is kept constant. In this case, in order to reliquidize the evaporated helium by the cooling head 11, it is necessary to keep the temperature of the cooling head 11 lower than the temperature of the liquid helium 6. This is because the temperature difference functions to take heat from the evaporated helium. Of course, the liquid stays in the lower portion of the cooling chamber 7. Hence, the refrigerating machine 10 and the cooling head 11 must be disposed in the upper portion of the cooling chamber 7.

It is known that generally, the efficiency of the refrigerating machine 10 for cooling the chip 2 is not good. The refrigerating machine 10 tends to have a larger volume and a larger weight (see S. Kotani, et al., "A Sub-ns-Clock Cryogenic System for Josephson Computers", IEEE Transactions on Applied Superconductivity, Vol. 1, No. 4 Dec., 1991). Hence, it is necessary to arrange the large-volume, heavy refrigerating machine in the upper portion of the cooling chamber 7. This needs a large and strong supporting mechanism, which leads to an increase in size of the overall mounting apparatus.

SUMMARY OF THE INVENTION

It is a general object of the present invention to provide an apparatus for mounting a superconducting element in which the above disadvantages are eliminated.

A more specific object of the present invention is to provide a compact apparatus for mounting a superconducting element.

The above objects of the present invention are achieved by an apparatus for mounting a superconducting element comprising:

a first chamber which accommodates a first coolant and maintains the superconducting element at very low temperature;

a second chamber which accommodates a second coolant and is thermally connected to the first chamber via a barrier member, the second coolant being liquidized at a temperature lower than that of the first coolant; and cooling means, connected to the second chamber, for liquidizing the first coolant.

The above objects of the present invention are also achieved by an apparatus for mounting a superconducting element comprising:

a first chamber which accommodates a coolant and maintains the superconducting element at very low temperature;

a second chamber provided outside of the first chamber so that an adiabatic layer thermally independent of the first chamber is formed; and cooling means, connected to the first chamber, for cooling the first chamber so as to liquidize the coolant.

The above objects of the present invention are also achieved by an apparatus for mounting a superconducting element comprising:

a cooling chamber having a first wall part and a second wall part, the first wall part comprising a material having thermal conductivity higher than that of the second wall part, the first wall part and the second wall part cooperating so as to form a sealed adiabatic layer, the first wall part defining a coolant accommodating part which accommodates a coolant and maintains the superconducting element at very low temperature;

a lid hermetically sealing an opening formed in an upper portion of the cooling chamber; and cooling means, connected to the cooling chamber, for cooling the cooling chamber so as to liquidize the coolant.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2:
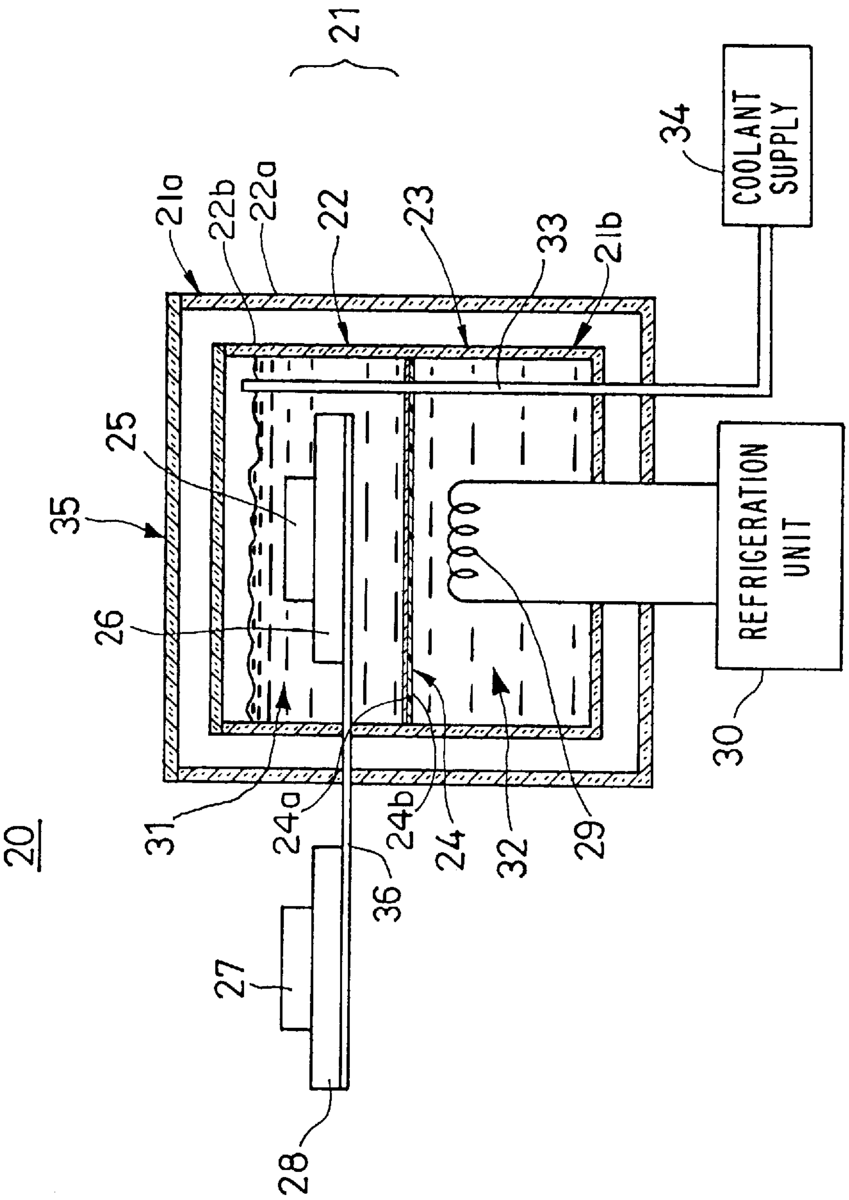
FIG. 2 is a cross-sectional view of an apparatus for mounting a superconducting element according to a first embodiment of the present invention.

FIG. 2 is a cross-sectional view of an apparatus 20 for mounting a superconducting element (chip) according to a first embodiment of the present invention. The apparatus 20 includes a cooling chamber 21 made up of a first chamber 22 and a second chamber 23. Each of the first and second chambers 22 and 23 is a vacuum adiabatic chamber made of, for example, FRP (Fiber Reinforced Plastic). Instead of FRP, an aluminum alloy can be used to form the vacuum adiabatic chambers. A first coolant 31 is provided in the first chamber 22, and a second coolant 32 is provided in the second chamber 23.

A barrier plate 24 is provided at the interface between the first chamber 22 and the second chamber 23. For example, the barrier plate 24 is a stacked film of two (2) layers **24*a* and 24*b*, one of which a polyimide film and the other, a copper flake (i.e., a thin flat copper layer) which are stacked in alternate succession; while either one may be stacked above the other, as desired, it is suggested by the cross sectioning that layer 24*a* is of metal and layer 24*b* is of polyimide. The polyimide film provides rigidity of the barrier plate 24, and the copper film flake, or layer, realizes impermeability between the first coolant 31 and the second coolant 32. The copper layer also functions to improve the heat conductivity of the barrier plate 24**.

The first chamber 22 accommodates an integrated circuit element (chip) 25 to be cooled, such as a Nb Josephson-junction element. The cooled chip 25 is mounted on a circuit board 26 made of a ceramic. The circuit board 26 is electrically connected to a circuit board 28 (made of, for example, a ceramic) on which a room-temperature-operation chip 27 is mounted by means of an electric-signal cable 36 penetrating through a vacuum adiabatic layer of the first chamber 22. The cable 36 connecting the chips 25 and 27 together is short. Hence, high-speed synchronizing operation on the chips 25 and 27 can be achieved.

A cooling head 29 is provided in the second chamber 23. The cooling head 29 has a Joule-Thomson valve using helium having an atomic weight of 4 (hereinafter simply referred to as $^4$He), and is connected to a refrigerating machine 30 (which has, for example, a composite structure of a plurality of refrigerating machines such as a GM refrigerating machine and a JT refrigerating machine). The cooling head 29 is supplied with cooled $^4$He, and cools the second coolant 32. As has been described previously, the refrigerating machine 30 has a large volume and a large weight.

A coolant introducing pipe 33 has an upper opening located in an upper the upper position in the first chamber 22, and vertically penetrates through the lower coolant chamber 23. The other opening of the coolant introducing pipe 33 is connected to a coolant supply device 34 functioning as a pressure control unit. The coolant introducing pipe 33 is made of a low thermal conductivity material such as reinforced plastic in order to prevent easy thermal exchange between the first chamber 22 and the second chamber 23 via the pipe 33.

The coolant supply device 34 supplies the first coolant 31 to the first chamber 22 via the coolant introducing pipe 33. By supplying the first coolant 31 to the first chamber 22, the pressure in the first chamber 22 is increased. Hence, the coolant supply device 34 can control the pressure in the first chamber 22 by controlling the quantity of the first coolant 31 supplied to the first chamber 22, so that the load applied to the barrier plate 24 can be reduced.

A detailed description will now be given of the first coolant 31 provided in the first chamber 22 and the second coolant 32 provided in the second chamber 23. According to the first embodiment of the present invention, the first coolant 31 provided in the first chamber 22 has a nature different from that of the second coolant 32 provided in the second chamber 23.

More particularly, the first coolant 31 is $^4$He, and the second coolant 32 is helium having an atomic weight of 3 (hereinafter simply referred to as $^3$He). The first coolant 31 of $^4$He is liquidized at 4.2 K (equal to 269° C. below zero) under the atmospheric pressure. The second coolant 32 of $^3$He is gas at 3.2 K or higher. Further, the coolant head 29 has a cooling capability of down to approximately 4.0 K. Hence, the gas of the second coolant ($^3$He) 32 cooled to 4.0 K takes heat from the first coolant 21 via the barrier plate 24 having good thermal conductivity, and liquidizes the first coolant 31. Further, the gas of the second coolant 32 is warmed to 4.2 K by taking the heat from the first coolant 31. Hence, the temperature difference occurs, and the second coolant 32 is circulated and cooled by the cooling head 29.

In the above manner, even when the integrated circuit chip 25 generates heat, which causes the temperature of the first coolant 31 to rise, the first coolant 31 is cooled by the second coolant 32, so that the predetermined cooling temperature can be maintained. As a result, it is possible to stably operate the integrated circuit chip 25.

In short, the mounting device 20 according to the first embodiment of the present invention has the first chamber 22 and the second chamber 23 separated from each other, and the chip 25 to be cooled is placed in the first chamber 22 and the cooling head 29 is placed in the second chamber 23. The cooling head 29 cools the first coolant 31 via the second coolant 32, so that the chip 25 can be maintained within the temperature range which ensures the stable operation thereof.

The structure shown in FIG. 2 having the first chamber 22 and the second chamber 23 has a large degree of freedom in the positional arrangement. Hence, it becomes possible to locate the second chamber 23 accommodating the cooling head 29 below the first chamber 22. Hence, it becomes possible to arrange the large-volume, heavy refrigerating machine 30 in the lowermost position of the mounting device 20 located below the second chamber 23. Hence, the supporting mechanism conventionally used is no longer needed, and down-sizing of the apparatus 20 can be made.

Figure 1:
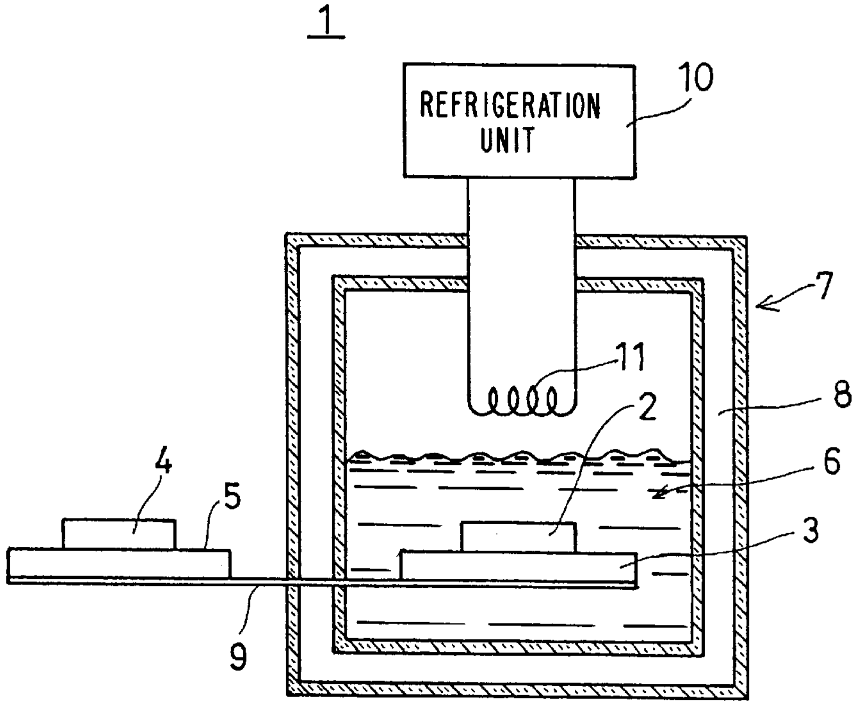
FIG. 1 PRIOR ART
FIG. 1 is a cross-sectional view of a conventional apparatus for mounting a superconducting element.
Figure 3:
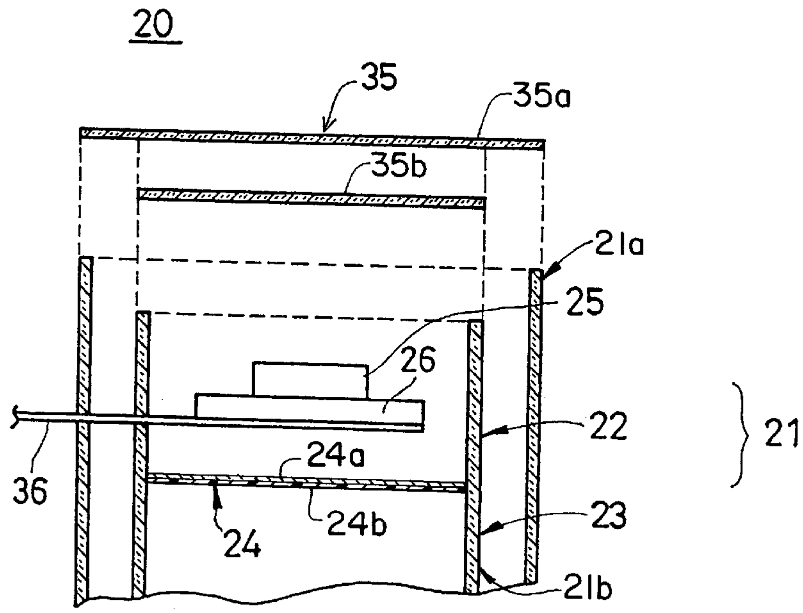
FIG. 3 is an enlarged cross-sectional view of a part of the appartatus shown in FIG. 2.

The apparatus 20 does not have anything in the upper portion of the first chamber 22. Hence, as shown in FIG. 3, it is possible to provide an openable lid 35 in the upper portion of the first chamber, opposite to the barrier plate 24. The lid 35 has a first lid 35*a* attached to the outer housing 21*a* of the coolant chamber 21 and a second lid 35*b* attached to the inner housing 21*b* thereof. The lid 35 facilitates mounting of the integrated circuit chip 25 and maintenance of the apparatus.

A description will now be given, with reference to FIG. 4, of an apparatus 120 for mounting a cooled integrated circuit chip 125 such as a Josephson-junction element according to a second embodiment of the present invention. The apparatus 120 includes a first chamber 122 (depicted by a stippled strip), and a second chamber 123.

Figure 5:
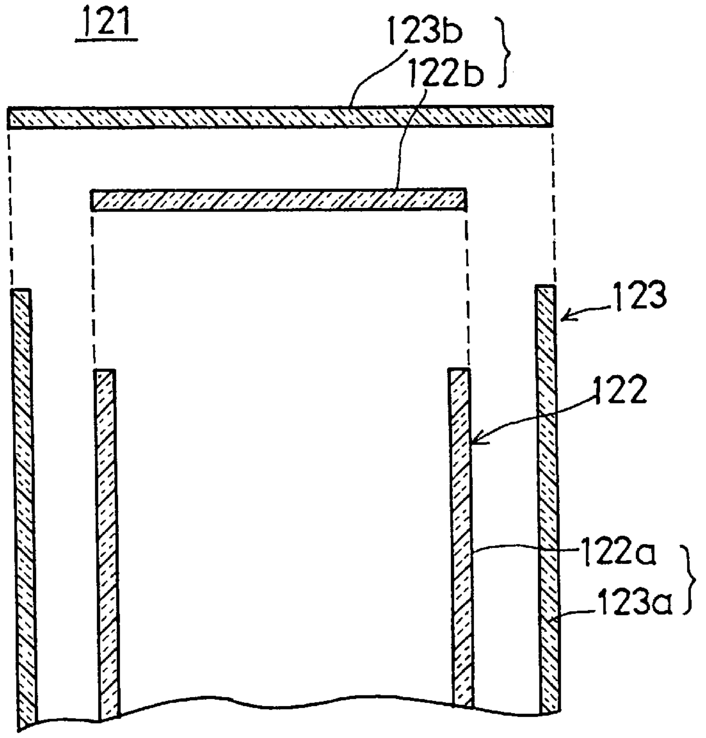
FIG. 5 is an enlarged cross-sectional view of a part of the apparatus shown in FIG. 4.

The first chamber 122 has a body 122*a* of a hollow square pole having a bottom, and a lid 122*b* attached to an opening formed at the uppermost portion of the body 122*a* in the vertical direction. The second chamber 123 has a body 123*a* of a hollow square pole having a bottom, and a lid 123*b* attached to an opening formed at the uppermost portion of the body 123*a* in the vertical direction. As shown in FIG. 5, the lids 122*b* and 123*b* are detachable with respect to the bodies 122*a* and 123*a*, respectively. The above detachable attachment facilitates mounting and replacement of the integrated circuit chip 125 placed in the first chamber 122. The lids 122*b* and 123*b* are respectively fastened to the bodies 122*a* and 123*b* so that ribbons, made of a light metal such as indium, are provided on the upper ends of the bodies defining the openings and are crushed by the lids 122*b* and 123*b*.

The first chamber 122 is made of a metallic material having good thermal conductivity (for example, copper), and the second chamber 123 is made of, for example, FRP. The second chamber 123 is bigger than the first chamber 122, and houses the first chamber 122. Hence, an adiabatic layer 131 is defined between the first chamber 122 and the second chamber 123, and is vacuumed by means of a vacuum device (not shown).

The first chamber 122 accommodates the integrated circuit chip 125 and a coolant 124 in which the chip 125 is placed. The coolant 124 cools the chip 125. The coolant 124 is, for example, liquid helium, and cools the chip 125 to very low temperature (for example, 269° C.). The chip 125 is mounted on a circuit board 126 made of, for example, a ceramic material, and is electrically connected to circuit boards 128, on which corresponding room-temperature-operation circuit chips 127 are mounted, by means of electric-signal cables 136 penetrating the vacuum adiabatic layer 131. The cables 136 connecting the chips 125 and 127 together are short. Hence, high-speed synchronizing operation the chips 125 and 127 can be achieved.

Figure 6:
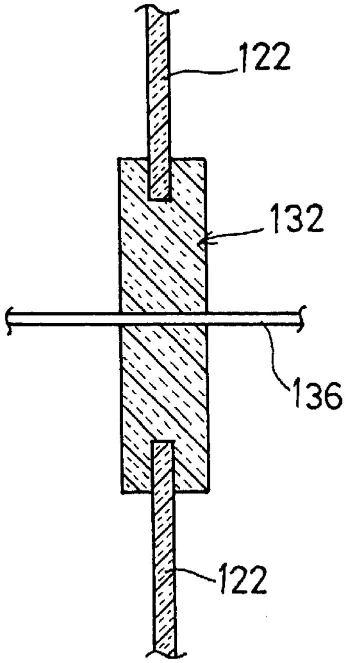
FIG. 6 is an enlarged cross-sectional view of another part of the apparatus shown in FIG. 4.

FIG. 6 is an enlarged cross-sectional view of the cable 36 penetrating through the first chamber 122. As has been described previously, the first chamber 122 is made of an electrically conductive metal such as copper. The signal cables 136 have a wiring pattern coated with a polyimide film. Such a polyimide film cable has high-speed signal propagation performance and low thermal conductivity, and is therefore suitable for the signal cables 136.

Generally, polyimide and copper may adhere to each other by a suitable adhesive although such adhesion is not easy to achieve in practice. Unless the first chamber 122 and the signal cables 136 are surely joined, the coolant 124 in the first chamber 122 may leak to the adiabatic layer 131 or the vacuum state of the adiabatic layer 131 may be broken. Hence, it is necessary to securely join the first chamber 122 and the signal cables 136 together.

Figure 4:
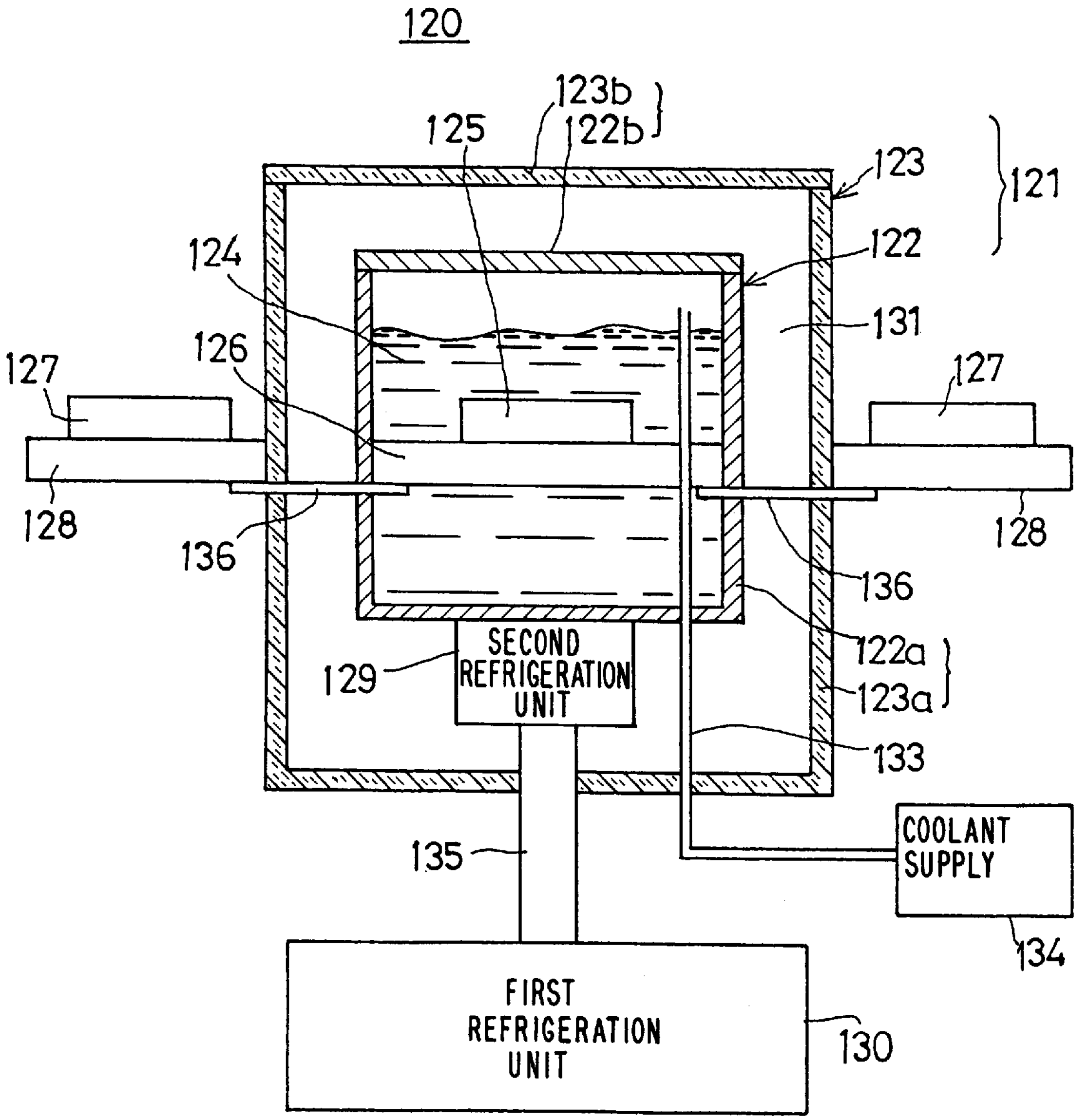
FIG. 4 is a cross-sectional view of an apparatus for mounting a superconducting element according to a second embodiment of the present invention.

With the above in mind, a holder 132 made of FRP is employed, as shown in FIG. 4, in FIG. 6 (this is not shown for the sake of simplicity). The holder 132 is attached to the first chamber 122, and the signal cable 136 is made to penetrate through the holder 132. As is known, FRP has good affinity to copper and polyimide. Thus, it is possible to securely join the first chamber 122 and the holder 132 together and securely join the signal cable 136 and the holder 132. As a result, the above-mentioned leakage of the coolant 124 and the breakdown of the adiabatic layer 131 are avoided.

Turning to FIG. 4 again, a second refrigerating machine 129 is disposed below the first chamber 122. The refrigerating machine 129 is connected to a first refrigerating machine 130 via a coolant supply pipe 135. The cooling unit suitable for the superconducting element mounting apparatus 120 has a composite structure composed of a plurality of refrigerating machines, such as a GM refrigerating machine and a JT refrigerating machine as has been described with respect to the first embodiment of the present invention.

Helium gas cooled by the first refrigerating machine 130 is sent to the second refrigerating machine 129 via the coolant supply pipe 135, and is further cooled by the second refrigerating machine 129. In this manner, the first chamber 122 is cooled. The cooling unit made up of the first and second refrigerating machines 129 and 130 has a large volume and is heavy, as has been described previously.

The installed position of the second refrigerating machine 129 with respect to the first refrigerating machine 122 will be described. As has been described, the first chamber 122 is filled with the coolant 124 such as liquid helium, which is evaporated due to heat generated by the chip 125. In order to cool the chip 125 within the predetermined temperature range and thereby operate the chip 125 stably, it is necessary to cool the evaporated helium gas to be liquidized.

The first chamber 122 is made of a material having good thermal conductivity such as copper. Hence, the overall first chamber 122 can be cooled to a sufficiently low temperature to liquidize the coolant 124 even when the second refrigerating machine 129 is attached to a surface position of the first chamber 122. That is, the structure shown in FIG. 4 has a large degree of freedom in the arrangement of the second refrigerating machine 129 with respect to the first chamber 122.

A coolant introducing pipe 133 has an upper opening located in the upper position in the first chamber 122, and vertically penetrates through second coolant chamber 123.

The other opening of the coolant introducing pipe 133 is connected to a coolant supply device 134 functioning as a pressure control unit. The coolant introducing pipe 133 is made of a low thermal conductivity material such as reinforced plastic in order to prevent easy thermal exchange between the first chamber 122 and the second chamber 123 via the pipe 133.

The coolant supply device 134 supplies the coolant 124 to the first chamber 122 via the coolant introducing pipe 133. By supplying the coolant 124 to the first chamber 122, the pressure in the first chamber 122 is increased. Hence, the coolant supply device 134 can control the pressure in the first chamber 122 by controlling the quantity of the coolant 124 to be supplied to the first chamber 122, so that the load applied to the first chamber 122 can be reduced.

In short, since the apparatus 120 employs the first chamber 122 made of a material having good thermal conductivity, the second refrigerating machine 129 has a large degree of freedom in arrangement with respect to the first refrigerating machine 130. Hence, it is possible to locate the second refrigerating machine 129 vertically below the first chamber 122. In this case, it becomes possible to locate the first refrigerating machine 130 below the first chamber 122. In the above manner, the large-scale refrigerating machines 129 and 130 can be placed at the lowermost portion of the machine apparatus 120, so that the supporting mechanism conventionally used can be omitted and downsizing of the apparatus 120 can be achieved. Instead of the conventional supporting mechanism, the openable lids **122*b* and 123*b* can be provided, so that mounting of the chip 125** and maintenance work can be facilitated.

Figure 7:
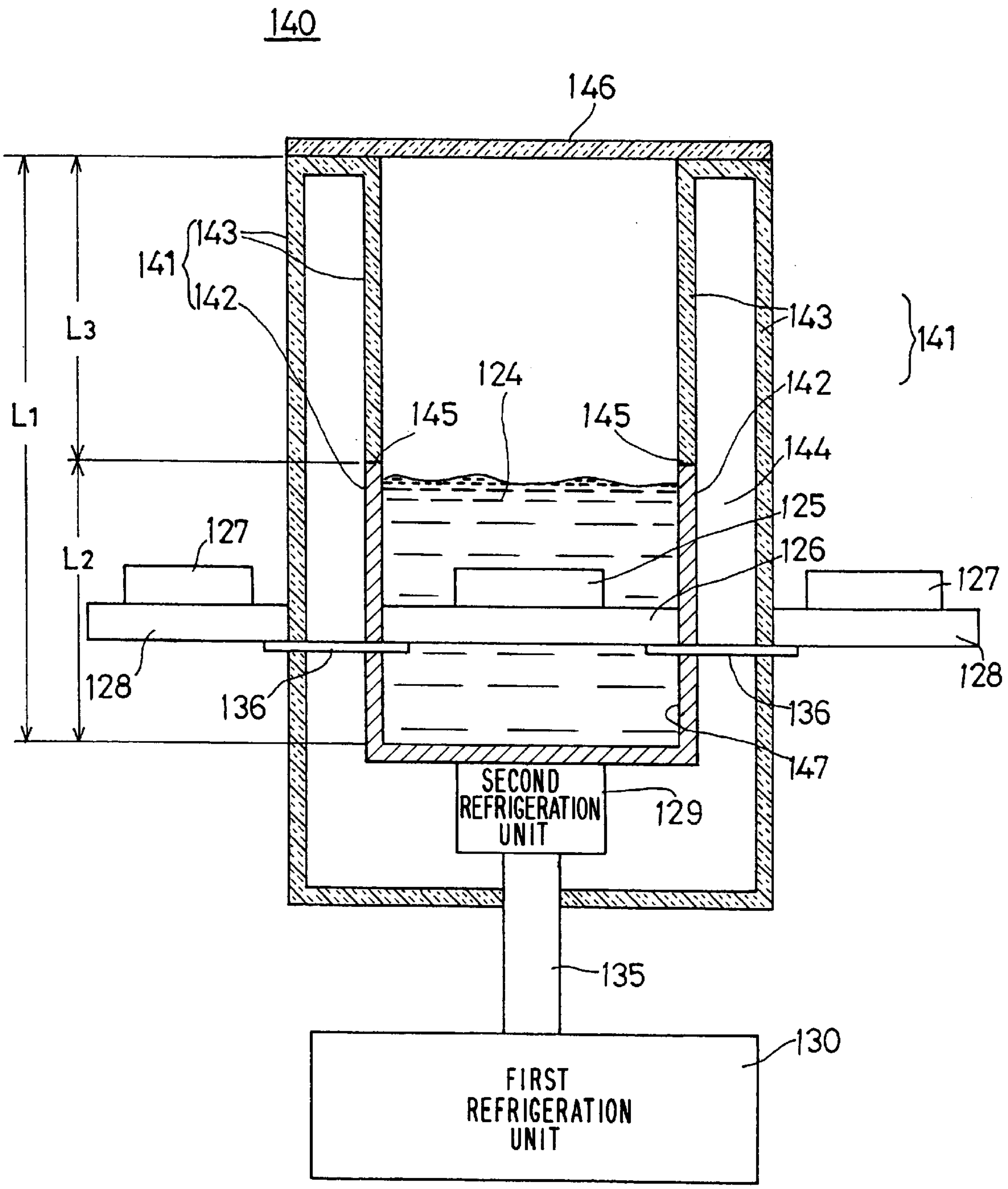
FIG. 7 is a cross-sectional view of an apparatus for mounting a superconducting element according to a third embodiment of the present invention.

FIG. 7 shows a superconducting element mounting apparatus 140 according to a third embodiment of the present invention. In FIG. 7, parts that are the same as those shown in FIG. 4 are given the same reference numbers as previously. The apparatus 140 is characterized in that a coolant chamber 141 is made up of a first wall part 142 (depicted by a stippled strip) and a second wall part 143. The first wall part 142 is made of a material having good thermal conductivity such as copper. The second wall part 143 is made of a material having thermal conductivity lower than that of the first wall part 142. Such a material of the second wall part 143 is, for example, FRP. The first wall part 142 and the second wall part 143 are joined together at a position indicated by a reference number 145. Hereinafter, the above position 145 is referred to as a joint portion 145. The wall parts 142 and 143 cooperate with each other and defines a hermetically sealed adiabatic layer 144. A lid 146 is attached to an opening formed in the upper portion of the coolant chamber 141, and seals the coolant chamber 141.

The coolant 124 is accommodated in a coolant accommodating part 147 of a square pole having the bottom defined by the first wall part 142. The cooled integrated circuit chip 125 is placed in the coolant 124 accommodated in the coolant accommodating part 147.

The first wall part 142 and the second wall part 143 are joined at the joint portion 145 and cooperate so as to define the adiabatic layer 144. Hence, even when the lid 146 is removed from the cooling chamber 141, the adiabatic layer 144 can be maintained in the vacuum state. As a result, it becomes unnecessary to set the adiabatic layer 144 to the vacuum state after the maintenance work is completed, so that the maintenance work can be facilitated.

A description will now be given of the structure of the cooling chamber 141 by referring to the concrete dimensions of the cooling chamber 141.

The cooling chamber 141 used in the third embodiment of the present invention has a length L1 in the vertical direction equal to, for example, 20 cm. In this case, the length L2 of the first wall part 142 in the vertical direction is, for example, 4 cm, and the length L3 of the second wall part 143 in the vertical direction is, for example, 16 cm (it will be noted that in FIG. 7, the length L2 of the first wall part 142 is less than the length L3 of the second wall part 143 for the sake of convenience). In the structure shown in FIG. 7, the coolant accommodating part 147 is connected to the outside of the apparatus 140 via the second wall part 143 and the lid 146. Hence, it is necessary to control the inflow of heat from the outside of the cooling chamber 141 via the second wall part 143 and the lid 146.

According to the third embodiment of the present invention, the length L3 of the second wall part 143 made of FRP which does not have good thermal conductivity is set to be enough long to prevent inflow of heat from the outside of the cooling chamber 141. The aforementioned second embodiment of the present invention needs the width of the adiabatic layer 131 as short as 3 cm because the first chamber 122 is closed and the adiabatic layer 131 completely surrounds the first chamber 122. On the other hand, the second wall part 143 needs the length L3 as long as approximately five times (15 cm) the width of the adiabatic layer 131.

In the second embodiment of the present invention, most of the first chamber 122 is filled with the liquidized coolant 124, while in the third embodiment the level of the coolant 124 is equal to or lower than that of the joint portion 145. The reason is as follows.

The gas coolant comes into contact with the first wall part 142 made of a thermally conductive metal and cooled by the refrigerating machine 129, whereby heat is taken from the gas coolant. The first wall part 142 has an approximately even temperature distribution because it is made of a good thermally conductive metal. The second wall part 143 made of FRP and located above the first wall part 142 has an abrupt temperature gradient because the second wall part 143 has low thermally conductivity. Hence, the coolant 124 cannot be liquidized. As a result, the coolant 124 is liquidized in the coolant accommodating part 147 formed by the first wall part 142. Hence, in the apparatus 140, the integrated circuit chip 125 must be placed below the joint portion 145.

Figure 8:
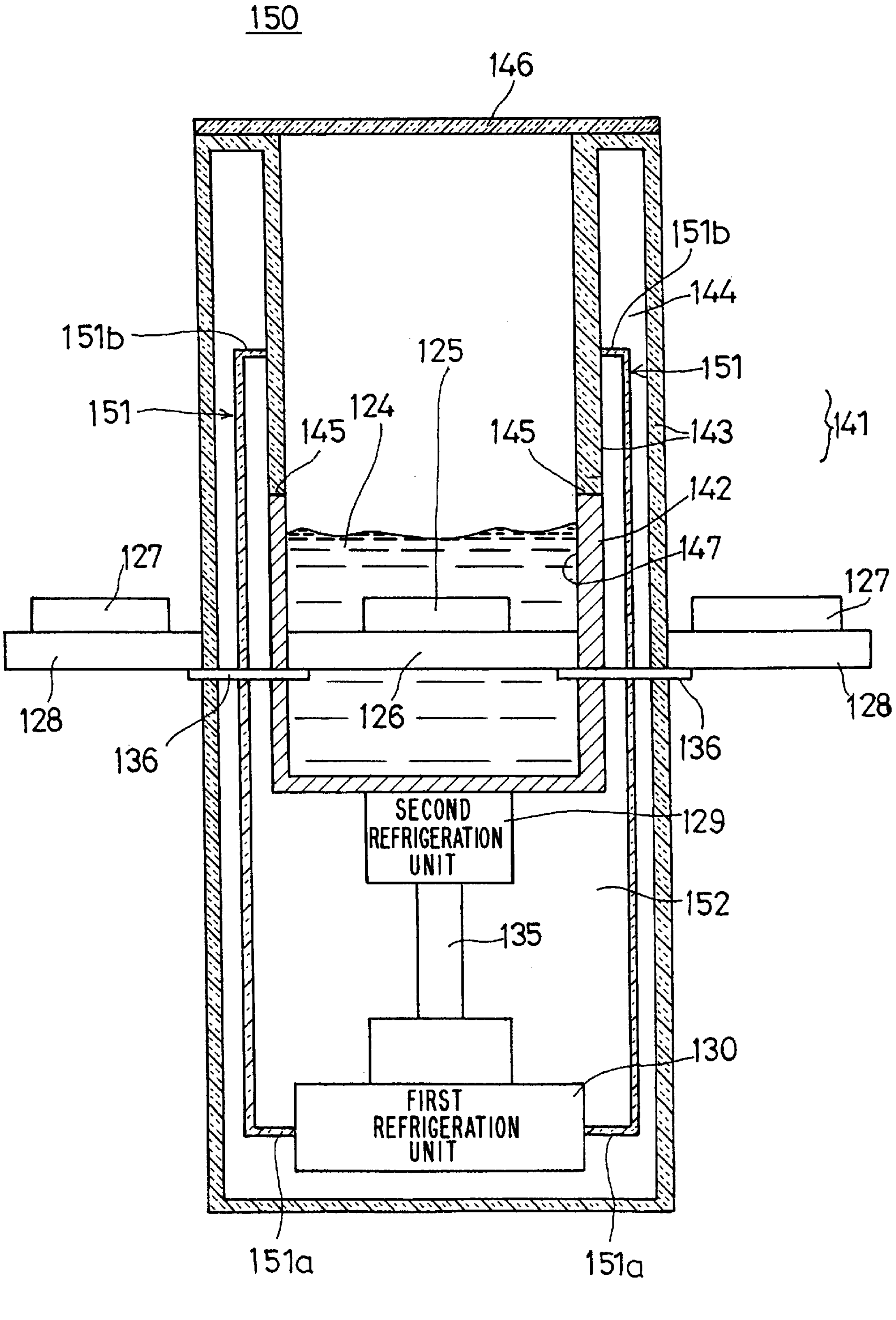
FIG. 8 is a cross-sectional view of an apparatus for mounting a superconducting element according to a fourth embodiment of the present invention.

FIG. 8 shows a superconducting element mounting apparatus 150 according to a fourth embodiment of the present invention. In FIG. 8, parts that are the same as those shown in FIG. 7 are given the same reference numbers as previously. The apparatus 150 is characterized in that a third wall part 151 is provided in the adiabatic layer 144 and defines an adiabatic layer 152 connected to the adiabatic layer 144 and used to cool the refrigerating machines 129 and 130. The adiabatic layer 152 has the same degree of vacuum as the adiabatic layer 144. The third wall part 151 is made of a metallic material having good thermal conductivity such as copper. With the above structure, the adiabatic layers 144 and 152 can be concurrently set to the vacuum state, and the maintenance work can be facilitated.

As has been described previously, the cooling means is made up of a plurality of refrigerating machines (the first and second refrigerating machines 129 and 130 in the case of the structure shown in FIG. 8). Generally, the energy efficiency in cooling by each of the refrigerating machines becomes lower as the temperature becomes lower. For example, the energy efficiency of a refrigerating machine having a generation capability of 4 K is approximately equal to 1/2000, and the energy efficiency of a refrigerating machine having a generation capability of 50 K is approximately equal to 1/50. Hence, in the case of the cooling means having a multi-stage structure, the refrigerating machine of an intermediate stage is made to have a cooling capability higher than that of the refrigerating machine of the final stage. For this reason, the first refrigerating machine 130 is selected so that it has a cooling capability higher than that of the second refrigerating machine 129.

With the above in mind, as shown in FIG. 8, the first refrigerating machine 130 having a high cooling capability is connected to a lower portion 151*a* of the third wall part 151, and an upper portion 151*b* of the third wall part 151 is connected to the second wall part 143 located above the joint portion 145. With this structure, it becomes possible to interrupt the inflow of heat invading into the coolant accommodating part 147 from the outside of the cooling chamber 141 and to reduce the time necessary to cool the inside of the coolant accommodating part 147.

Figure 9:
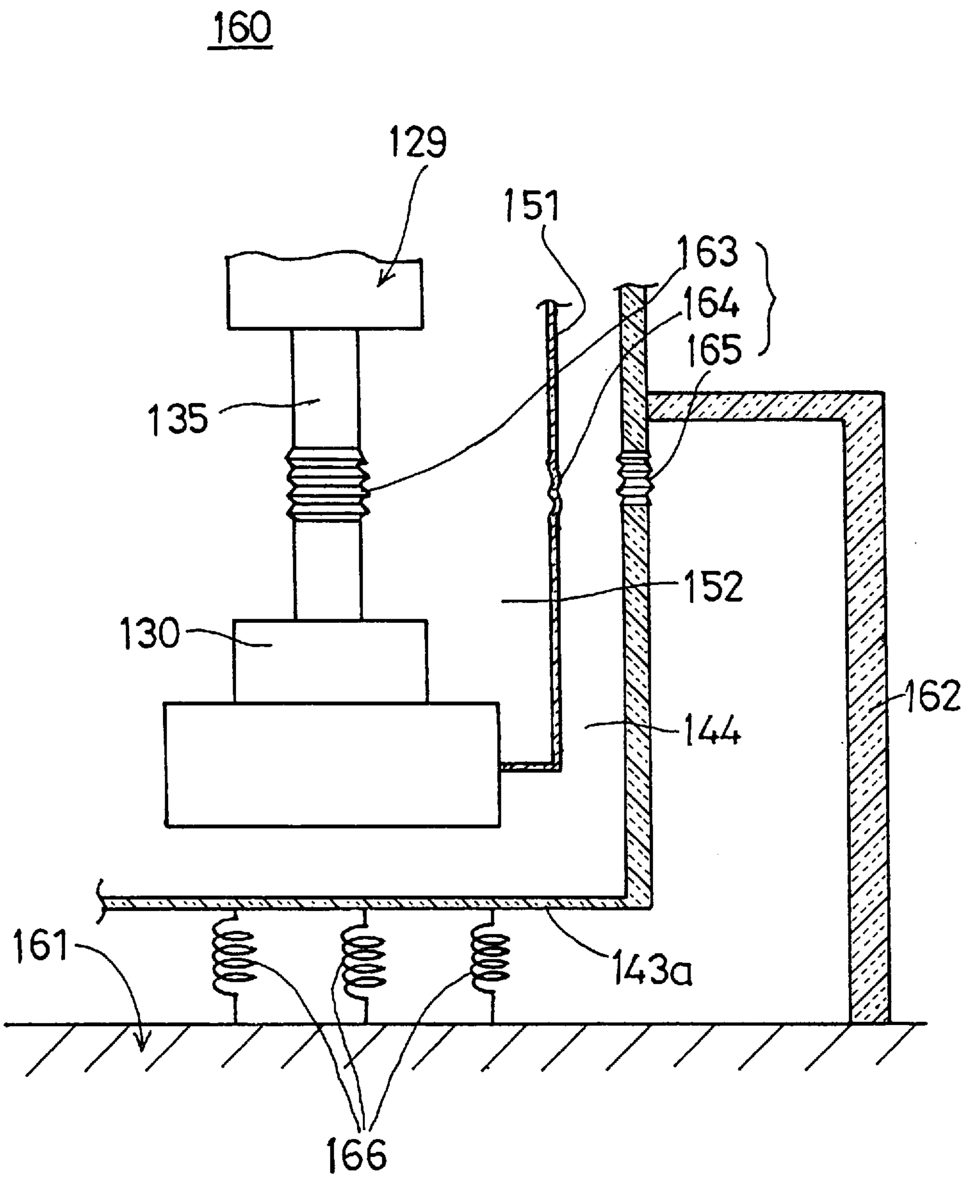
FIG. 9 is a cross-sectional view of an apparatus for mounting a superconducting element according to a fifth embodiment of the present invention.

FIG. 9 shows a superconducting element mounting apparatus 160 according to a fifth embodiment of the present invention. In FIG. 9, parts that are the same as those shown in FIG. 8 are given the same reference numbers. FIG. 9 shows an enlarged view in the vicinity of the first refrigerating machine 130.

Generally, the refrigerating machine has a built-in structure which generates a vibration, such as an expander, and hence generates vibration in operation. In the structure shown in FIG. 8, the first refrigerating machine 130 is directly connected to the first and second wall parts 142 and 143 by the third wall part 151 and the coolant supply pipe 135. In this structure, a vibration generated by the first refrigerating machine 130 is applied to the circuit board 126, and affects the operation of the cooled integrated circuit chip 125. Further, the portions of the first and second wall parts 142 and 143 through which the cables 136 penetrate may be deteriorated with age.

With the above in mind, in the apparatus 160, the second wall part 143, serving as the outermost wall part of the apparatus 160, is supported by a supporting member 162 fixed to a floor surface 161. Further, flexible structure parts 163–165 comprising, for example, bellows, are provided in the coolant supply pipe 135, the second wall 143 and the third wall part 141, respectively. Furthermore, springs 166 are provided between a bottom portion 143*a* of the second wall part 143 and a floor surface 161 in order to absorb the vibration of the first refrigerating machine 130.

The vibration of the first refrigerating machine 130 is absorbed by the springs 166, and is prevented from being transmitted to the upper parts due to the flexible structure parts 163–165. Hence, it becomes possible for the vibration of the first refrigerating machine 130 to be applied to the circuit board 126 and the portions of the first and second wall parts 142 and 143 through which the signal cables 136 penetrate. As a result, it is possible to ensure the operation of the cooled integrated circuit chip 125 and improve the reliability of the mounting apparatus 160.

The present invention is not limited to the specifically described embodiments, and variations and modifications may be made without departing from the scope of the present invention.

What is claimed is:

1. An apparatus operational at a superconducting temperature, comprising:

a first chamber having an interior receiving and supporting therein a superconducting element and receiving therein a first coolant of a first volume sufficient for submerging the superconducting element in the first coolant, the first coolant having a first liquidizing temperature sufficient for maintaining the submerged superconducting element at the superconducting temperature;

a barrier member;

a second chamber receiving therein a second coolant, the second coolant contacting the barrier member and being thermally connected to the first chamber via the barrier member, the second coolant being at a second temperature which is lower than the first liquidizing temperature of the first coolant; and a cooling unit connected to the second chamber and maintaining the second coolant at the second temperature, the second coolant being in contact with the barrier member and, by heat transfer therethrough, liquidizing the first coolant.

2. The apparatus as claimed in claim 1, wherein the second chamber is located below the first chamber.

3. The apparatus as claimed in claim 1, wherein the barrier member comprises a stacked film structure of a copper film and a polyimide film.

4. The apparatus as claimed in claim 2, wherein the barrier member comprises a stacked film structure of a copper flake and a polyimide film.

5. The apparatus as claimed in claim 1, further comprising:

a pressure control device; and a pipe having a first end located in the first chamber and a second end connected to the pressure control device, the pressure control device controlling a pressure in the first chamber through the pipe.

6. The apparatus as claimed in claim 2, further comprising:

a pressure control device; and a pipe having a first end located in the first chamber and a second end connected to the pressure control device, the pressure control device controlling a pressure in the first chamber through the pipe.

7. The apparatus as claimed in claim 3, further comprising:

a pressure control device; and a pipe having a first end located in the first chamber and a second end connected to the pressure control device, the pressure control device controlling a pressure in the first chamber through the pipe.

8. The apparatus as claimed in claim 2, further comprising an openable lid positioned in a portion of the first chamber opposite to the barrier member.

9. The apparatus as claimed in claim 3, further comprising an openable lid positioned in a portion of the first chamber opposite to the barrier member.

10. The apparatus as claimed in claim 5, further comprises an openable lid positioned in a portion of the first chamber opposite to the barrier member.

11. The apparatus as claimed in claim 5, wherein the pipe is formed of a material which prevents the conduction of heat between the first coolant and the second coolant through the pipe.

12. An apparatus operational at a superconducting temperature, comprising:

a first chamber having a first interior receiving and supporting therein a superconducting element and receiving therein a first coolant of a first volume, sufficient for submerging the superconducting element in the first coolant, the first coolant having a first liquidizing temperature sufficient for maintaining the submerged superconducting element at the superconducting temperature, at least a portion of the first chamber comprising a member of high thermal conductivity;

a vacuum adiabatic layer surrounding and thermally isolating the first chamber; and a cooling unit, exterior of the first chamber and thermally coupled to the first interior thereof by the member of high thermal conductivity, liquidizing the first coolant within the first interior of the first chamber, the cooling unit further comprising:

a second chamber having a second interior and a second coolant in the second interior which is thermally coupled to the first coolant in the first interior of the first chamber by the member of high thermal conductivity, the vacuum adiabatic layer surrounding the second chamber, and a refrigeration unit, connected to the second chamber, maintaining the second coolant at a temperature less than the first liquidizing temperature of the first coolant, the second coolant liquidizing the first coolant by heat transfer through the member of high thermal conductivity.

13. An apparatus as recited in claim 12, wherein:

the second coolant has a second liquidizing temperature which is less than the first liquidizing temperature of the first coolant; and the temperature, at which the second coolant is maintained by the refrigeration unit, is greater than the second liquidizing temperature of the second coolant and, accordingly, the second coolant is maintained in a gaseous state.

14. An apparatus as recited in claim 13, wherein the refrigeration unit comprises a refrigeration machine and a cooling head coupled thereto, the refrigeration unit being connected to the second chamber with the cooling head thereof disposed within the interior of the second chamber and with the refrigeration machine thereof disposed exteriorally of the vacuum adiabatic layer and coupled to the cooling head.

15. An apparatus as recited in claim 14, further comprising:

an outer housing surrounding the first and second chambers and separated and thermally isolated therefrom by the vacuum adiabatic layer.

16. The apparatus as recited in claim 14 wherein the second chamber comprises generally vertical sidewalls defining upper and lower ends and upper and lower end closure members, the upper end closure member comprising the member of high thermal conductivity.

17. An apparatus operational at a superconducting temperature, comprising:

a first chamber having a first interior receiving therein a first coolant of a first volume and having a first liquidizing temperature maintaining a superconducting temperature within the interior;

a barrier member;

a second chamber having a second interior in thermal contact with the barrier member and thermally connected via the barrier member to the first interior of the first chamber, the second interior being at a second temperature which is lower than the first liquidizing temperature of the first coolant; and a cooling unit connected to the second chamber and maintaining the second interior thereof at the second temperature and, by heat transfer through the barrier member, liquidizing the first coolant received in the first interior of the first chamber.

18. The apparatus as claimed in claim 17, wherein the second chamber is located below the first chamber.

19. The apparatus as claimed in claim 17, wherein the barrier member comprises a stacked film structure of a copper film and a polyimide film.

20. The apparatus as claimed in claim 18, wherein the barrier member comprises a stacked film structure of a copper flake and a polyimide film.

21. The apparatus as claimed in claim 17, further comprising:

a pressure control device; and a pipe having a first end located in the first chamber and a second end connected to the pressure control device, the pressure control device controlling a pressure in the first chamber through the pipe.

22. An apparatus operational at a superconducting temperature, comprising:

a first chamber having a first interior receiving therein a first coolant of a first volume and having a first liquidizing temperature maintaining a superconducting temperature within the interior;

at least a portion of the first chamber comprising a member of high thermal conductivity; and a cooling unit, exterior of the first chamber, thermally coupled to the first interior thereof by the member of high thermal conductivity and liquidizing the first coolant within the first interior of the first chamber, the cooling unit further comprising:

a second chamber having a second interior which is thermally coupled to the first interior of the first chamber by the member of high thermal conductivity, and a refrigeration unit, connected to the second chamber, maintaining the second interior at a temperature less than the first liquidizing temperature of the first coolant, the second interior being in contact with the member of high thermal conductivity and liquidizing the first coolant by heat transfer through the member of high thermal conductivity; and a vacuum adiabatic layer surrounding and thermally isolating the first and second chambers.

23. An apparatus as recited in claim 22, wherein the refrigeration unit comprises a refrigeration machine and a cooling head coupled thereto, the refrigeration unit being connected to the second chamber with the cooling head thereof disposed within the interior of the second chamber and with the refrigeration machine thereof disposed exteriorally of the vacuum adiabatic layer and coupled to the cooling head.

24. An apparatus as recited in claim 23, further comprising:

an outer housing surrounding the first and second chambers and separated and thermally isolated therefrom by the vacuum adiabatic layer.

25. The apparatus as recited in claim 23, wherein the second chamber comprises generally vertical sidewalls defining upper and lower ends and upper and lower end closure members, the upper end closure member comprising the member of high thermal conductivity.

* * * * *

UNITED STATES PATENT AND TRADEMARK OFFICE

CERTIFICATE OF CORRECTION

PATENT NO.: 5,861,574
DATED : January 19, 1999
INVENTOR(S): Seigo KOTANI et al.

It is certified that error appears in the above-identified patent and that said Letters Patent is hereby corrected as shown below:

On the title page, [73] Assignees, before "Toyo" insert --Taiyo--.

Col. 3, line 62, delete "film".

Col. 6, line 21, delete "as shown in Fig. 4," and after "shown" (second occurrence) insert --in Fig. 4--.

Col. 7, line 26, delete "machine".

Signed and Sealed this

Twenty-ninth Day of February, 2000

*Attest:*

Q. TODD DICKINSON

*Attesting Officer* *Commissioner of Patents and Trademarks*